United States Patent [19]
Su et al.

[11] Patent Number: 6,046,945
[45] Date of Patent: Apr. 4, 2000

[54] DRAM REPAIR APPARATUS AND METHOD

[75] Inventors: Hua-Yu Su, Milpitas; Lik T. Cheng, San Jose, both of Calif.

[73] Assignee: Integrated Silicon Solution, Inc., Sunnyvale, Calif.

[21] Appl. No.: 08/890,696

[22] Filed: Jul. 11, 1997

[51] Int. Cl.[7] .................................................... G11C 7/00
[52] U.S. Cl. ..................... 365/200; 365/210; 365/230.06
[58] Field of Search .............................. 365/200, 230.03, 365/210, 230.06

[56] References Cited

U.S. PATENT DOCUMENTS

| | | | |
|---|---|---|---|
| 4,603,404 | 7/1986 | Yamauchi et al. | 365/200 |
| 5,218,572 | 6/1993 | Lee et al. | 365/200 |
| 5,323,348 | 6/1994 | Mori et al. | 365/200 |
| 5,452,251 | 9/1995 | Akaogi et al. | 365/230.03 |
| 5,487,040 | 1/1996 | Sukegawa et al. | 365/200 |
| 5,577,050 | 11/1996 | Bair et al. | 371/10.2 |

*Primary Examiner*—David Nelms
*Assistant Examiner*—David Lam
*Attorney, Agent, or Firm*—Gary S. Williams; Pennie & Edmonds LLP

[57] ABSTRACT

An apparatus and method for minimizing the access time incurred when accessing redundant columns of a dynamic random access memory (DRAM) is herein disclosed. A pair of redundant columns is associated with a defective column. Each pair of redundant columns has a single redundant column decoder that provides access to the column data in the pair of redundant columns. The redundant column decoder is enabled by the column repair circuitry when it receives a column address signal indicating that a defective cell is to be accessed. When a defective column is accessed, the column data from the pair of associated redundant columns is read onto the IO lines as well as the data from the defective column. The three voltages are combined forming an IO signal and the complements of the three voltages are combined forming an IO-BAR signal. The sense amplifier determines the column data value based on the differential between the IO and IO-BAR signals. When the IO signal has a higher voltage than the IO-BAR signal, the column data value is determined to be a one. When the IO-BAR signal has a higher voltage than the IO signal, the column data value is determined to be a zero.

10 Claims, 3 Drawing Sheets

DRAM REPAIR APPARATUS AND METHOD

The present invention relates generally to semiconductor memory devices and, particularly, to dynamic random access memories having a repair mechanism that does not disable a defective memory column.

BACKGROUND OF THE INVENTION

In memory systems, including those utilizing dynamic random access memory (DRAM) arrays, column repair circuitry and redundant columns are provided to compensate for defective memory columns. The column repair circuitry disables the defective column and accesses a redundant memory column that effectively replaces the defective memory column. The repair circuitry disables the defective column before attempting to access a target redundant column. However, by disabling the defective column before accessing a redundant column, the column access time of the DRAM is increased.

FIG. 1 illustrates a typical DRAM having a number of columns 102 and a number of redundant columns 104. Each column 102 has a pair of column bit lines 106, 108 coupled to a pair of column select gate transistors 110, 112. The column select gate transistors are coupled to a pair of IO lines, 114 (IO) and 116 (IO-BAR). The IO lines 114,116 are coupled to a sense amplifier 118. The column select gate transistors 110, 112 are disabled or activated by a column select line 124 that is generated by a respective column decoder 120. The column repair circuitry 122 enables or disables a particular column decoder through signal 126. The column repair circuitry 122 receives a column address signal 128 indicating a target column to be accessed. If the column is not defective, an enable signal 126 is transmitted to the appropriate column decoder. If the column is defective, a disable signal 126 is first transmitted to the appropriate column decoder followed by an enable signal 126 to the redundant column decoder.

Typically, a range of columns are accessed at a time. The column repair circuitry 122 disables the column decoders 120 of the defective columns within the access range before the respective redundant columns are accessed. Often it can take several buffer stages to drive the loadings of the disable signals. These buffer stages increase the access time of the redundant columns and thus the overall access time of the DRAM.

Accordingly, there exists a need for a DRAM repair scheme that overcomes these shortcomings.

SUMMARY OF THE INVENTION

In summary, the present invention pertains to an apparatus for minimizing the access time incurred when accessing redundant columns of a dynamic random access memory (DRAM). In the present invention, a pair of redundant columns is associated with a defective column. Each pair of redundant columns has a single redundant column decoder that provides access to the column data associated with the pair of redundant columns. The redundant column decoder is enabled by the column repair circuitry when it receives a column address signal indicating that a defective column is to be accessed.

When a defective column is accessed, the column data from the pair of associated redundant columns is read onto a pair of IO lines as well as the data from the defective column. Typically, the data is represented as a voltage. The three voltages from the defective and redundant columns are combined to form an IO signal and the complements of the three voltages are combined to form an IO-BAR signal.

A sense amplifier determines the column data value based on the difference between the IO and IO-BAR signals. Preferably, the sense amplifier is a differential amplifier where the IO signal is input to the non-inverting input and the IO-BAR signal is input to the inverting input. When the IO signal has a higher voltage than the IO-BAR signal, the column data value is determined to be a one. When the IO-BAR signal has a higher voltage than the IO signal, the column data value is determined to be a zero.

In this manner, the correct data in a pair of redundant columns will override the incorrect data in a defective column and the DRAM access time incurred in accessing defective memory cells is minimized since it eliminates the need to disable a defective column before its associated redundant column is enabled. The elimination of this overhead serves to improve the DRAM access time especially when accessing redundant columns.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
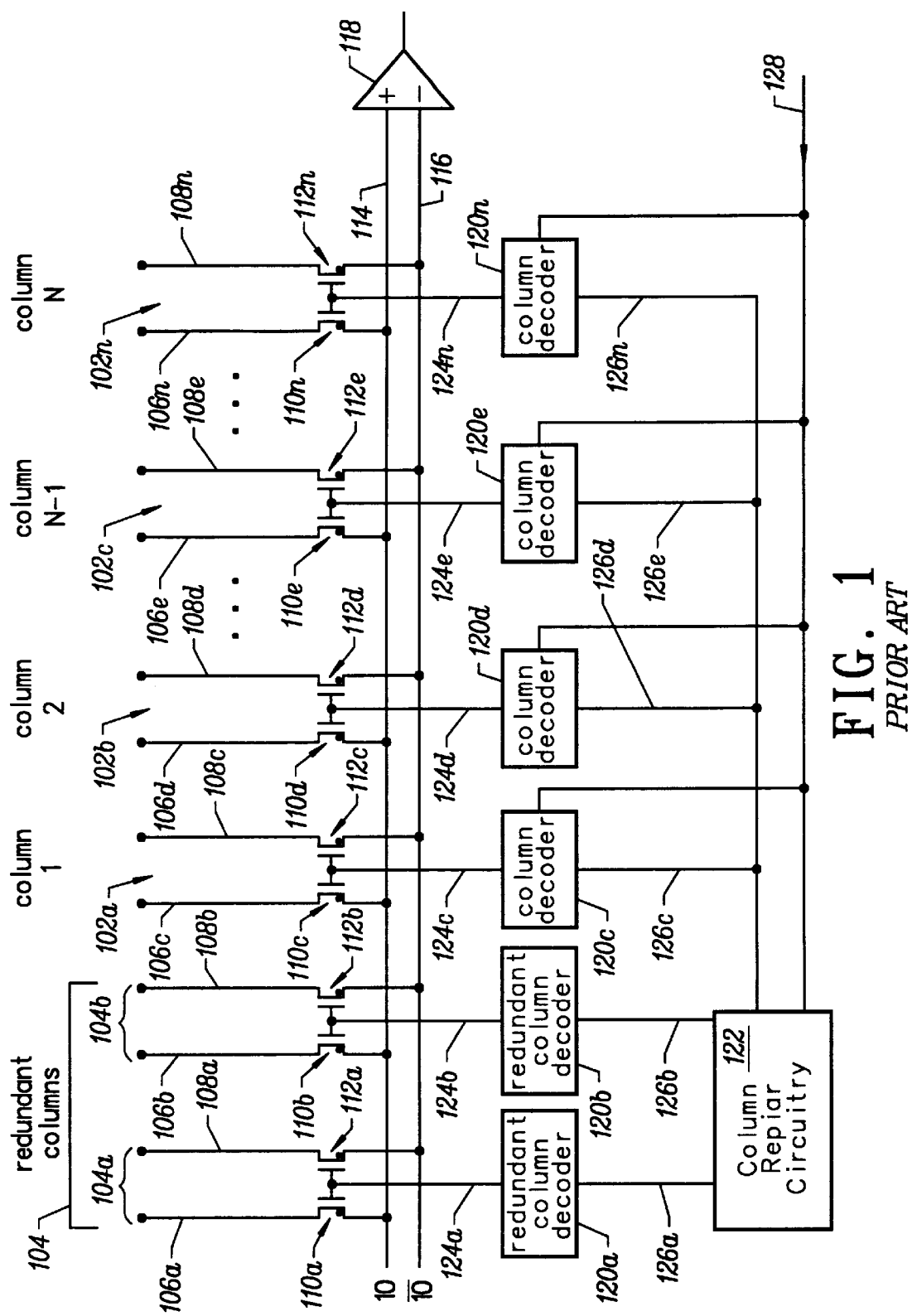
FIG. 1 is a block diagram of a prior art dynamic random access memory.
Figure 2:
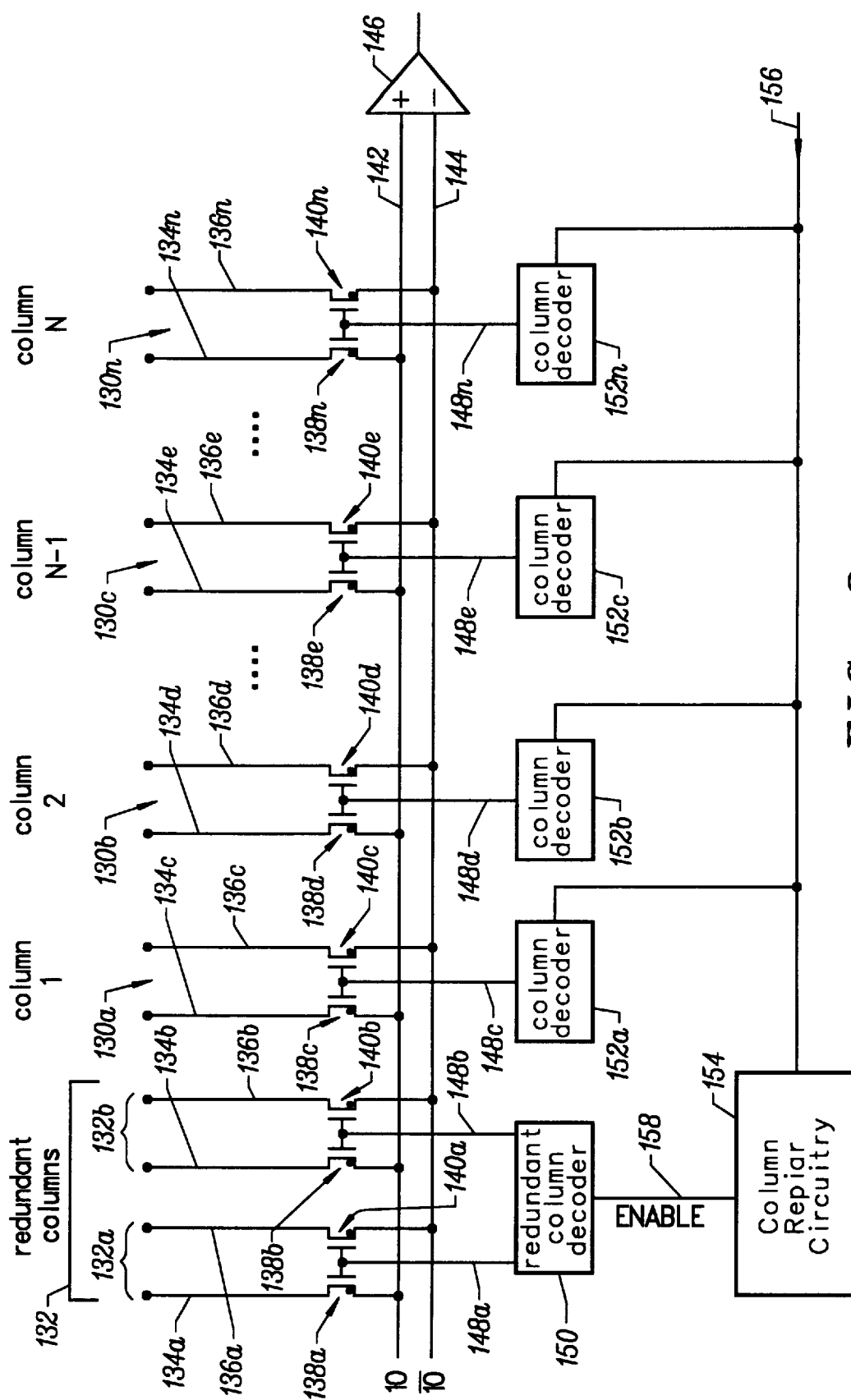
FIG. 2 is a block diagram of a DRAM memory of an embodiment of the present invention.

FIG. 2 illustrates a dynamic random access memory (DRAM) having a number of columns 130 and a number of rows (not shown). A number of redundant columns 132 are provided to accommodate for defective columns. In a preferred embodiment of the present invention, two redundant columns 132 are associated with a particular defective column.

Each column 130 has a pair of bit lines 134, 136 coupled to a pair of column select gate transistors 138, 140. One of the column select gate transistors is coupled to a first IO signal 142 (IO) and the second column select gate transistor is coupled to a second IO signal (IO-BAR) 144. The IO signals 142, 144 are coupled to a sense amplifier 146. The column select gate transistors 138, 140 are activated by a column select line 148 that is generated by a respective column decoder 150, 152.

In a preferred embodiment of the present invention, each pair of redundant columns associated with a defective column has its own column decoder 150. Each non-redundant column 120 is associated with a particular column decoder 152. The redundant column decoder 150 has two column select lines 148 that are used to enable the associated column select gate transistors 138, 140.

The column repair circuitry 154 receives a column address signal 156. When the column address is defective, the column repair circuitry 154 enables the appropriate redundant column decoder 150 by setting the decoder's 150 enable signal 158. The selected redundant column decoder 150, in turn, enables the corresponding column select lines 148.

The target column decoder 152 also receives the column address signal 156. In response to the column address signal 156, the non-redundant column decoder 152 activates the corresponding column select signal 148. When the target column is defective, the data read from the column will be incorrect.

The combined voltages from the target column 130 and from each of the redundant pair of columns 132 form the IO signal 142 and the complementary voltages form the IO-BAR signal 144. The IO signal 142 and the IO-BAR signal 144 are coupled respectively to the non-inverting and inverting inputs of the sense amplifier 146. In a preferred embodiment of the present invention, the sense amplifier 146 is a differential amplifier. The sense amplifier 146 determines the correct column data value based on the IO and IO-BAR signals.

Figure 3A:
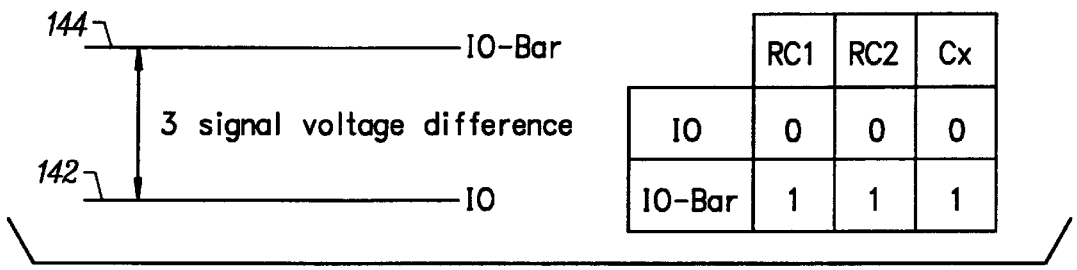
FIGS. 3A–3D illustrate expected IO and IO-BAR signals in an embodiment of the present invention.

FIGS. 3A–3D illustrate the states of the IO signals for different combinations of outputs from the defective and redundant columns. FIG. 3A illustrates the case where the pair of redundant columns ($RC_1$ and $RC_2$) representing the defective target column and the defective target column ($C_x$) output a "zero voltage" (i.e., a voltage representing a logical 0). The correct data is zero and the defective target column $C_x$ is stuck at zero. The voltages from each of the redundant columns and the target column are combined to form the IO signal. In this case, the IO signal level equals the sum of the three "zero" voltages.

The IO-BAR signal 144 is formed by combining the complementary voltages from each of the redundant columns and the target column. In this case, the complementary voltages are each a "one voltage" (i.e., a voltage representing a logical 1) and the combination is an IO-BAR signal 144 at three times the one voltage. The difference then between the IO and IO-BAR signal is a three signal zero voltage.

The sense amplifier 146 will determine that the column data value is a zero since the voltage applied to the inverting input (i.e., IO-BAR signal) is higher than the voltage applied to the non-inverting input (i.e., IO signal). When the voltage applied to the non-inverting input (i.e., IO signal) of the sense amplifier is higher than the voltage applied to the inverting input (i.e., IO-BAR signal), then the column data value is a one.

It should be noted that for the purposes of this discussion the term "zero voltage" can be any voltage that is used to represent a zero data value and the term "one voltage" can be a different voltage that is higher than the zero voltage and which is used to represent a one data value. The present invention is not constrained to any particular voltage values.

Figure 3B:
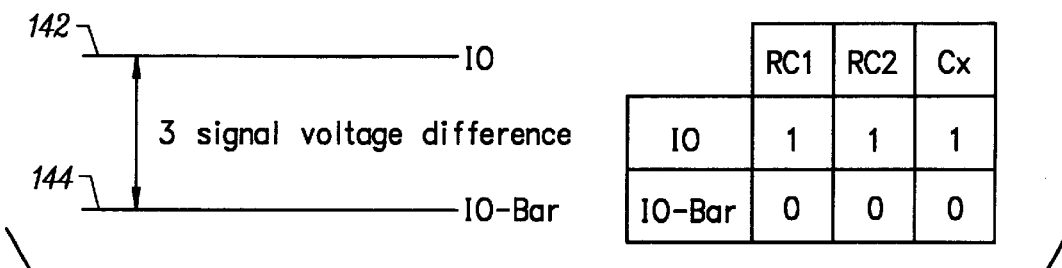

FIG. 3B illustrates the case where the pair of redundant columns ($RC_1$ and $RC_2$) representing the defective target column and the defective target column ($C_x$) each output a one voltage. The correct data is one and the defective target column $C_x$ is stuck at one. In this case, the voltages from each of the redundant columns and the target column are combined generating a three voltage IO signal 142.

The IO-BAR signal 144 is formed by combining the complementary voltages from each of the redundant columns and the target column. In this case, the complementary voltages are each zero and the combination is an IO-BAR signal 144 representing a zero voltage signal. The difference then between the IO and IO-BAR signal is a three signal one voltage. The sense amplifier reads out this voltage difference as a one.

Figure 3C:
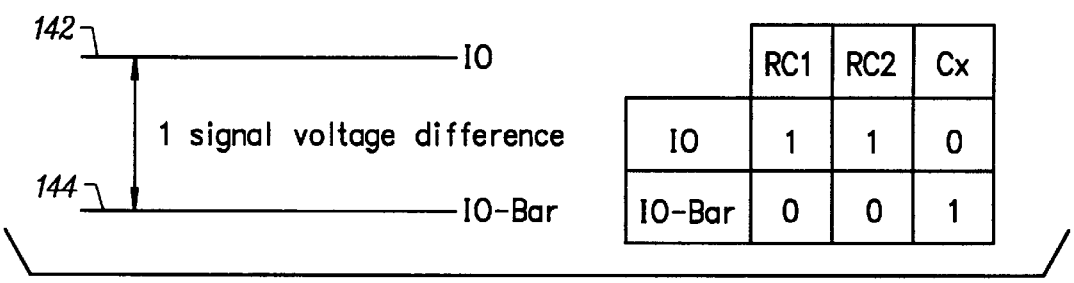

FIG. 3C illustrates the case where the pair of redundant columns ($RC_1$ and $RC_2$) representing the defective target column each output a one voltage and the defective target column ($C_x$) outputs a zero voltage. The correct data is one and the defective target column $C_x$ is stuck at zero. In this case, the voltages from each of the redundant columns and the target column are combined generating a one voltage IO signal 142.

The IO-BAR signal 144 is formed by combining the complementary voltages from each of the redundant columns and the target column. In this case, the complementary redundant column voltages are each zero and the complementary target column voltage is a one. The combination is an IO-BAR signal 144 representing a zero voltage signal. The difference then between the IO and IO-BAR signal is a single signal zero voltage.

In this case, the sense amplifier 146 determines that the column data value is a one since the voltage applied to the inverting input is higher than the voltage applied to the non-inverting input.

Figure 3D:
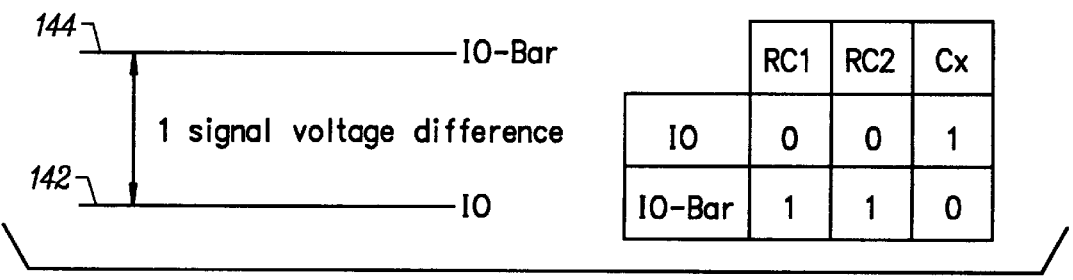

FIG. 3D illustrates the case where the pair of redundant columns ($RC_1$ and $RC_2$) representing the defective target column each output a zero voltage and the defective target column ($C_x$) outputs a one voltage. The correct data is zero and the defective target column is stuck at one. In this case, the voltages from each of the redundant columns and the target column are combined generating a zero voltage IO signal 142.

The IO-BAR signal 144 is formed by combining the complementary voltages from each of the redundant columns and the target column. In this case, the complementary redundant column voltages are each one and the complementary target column voltage is a zero. The combination is an IO-BAR signal 144 representing a one voltage signal. The difference then between the IO and IO-BAR signal is a single signal zero voltage.

In this case, the sense amplifier 146 determines that the correct data value is a zero since the voltage applied to the inverting input is higher than the voltage applied to the non-inverting input.

The above description has detailed the DRAM column repair apparatus of the present invention. The DRAM column repair apparatus is beneficial in that it minimizes the DRAM access time by eliminating the need to disable a column before its associated redundant column is enabled. The elimination of this overhead serves to improve the DRAM access time especially when accessing redundant columns.

Alternate Embodiments

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

In an alternate embodiment, the same repair scheme and apparatus can be applied to redundant word lines to repair defective rows. The prior art row repair circuitry disables the defective row and accesses a redundant memory row that effectively replaces the defective memory row. The repair circuitry disables the defective row before attempting to access a target redundant row. However, by disabling the defective row before accessing a redundant row, the row access time of the DRAM is increased.

In this alternate embodiment, two redundant rows are associated with a defective row. Each pair of redundant rows is associated with a single row decoder that activates the redundant row pair. The redundant row decoder is enabled by the row repair circuitry when it receives a row address signal indicating that a defective row is to be accessed.

When a defective row is requested, the row repair circuitry enables the appropriate redundant row decoder in order to activate the corresponding pair of redundant word lines. Data is then sensed from the three activated row lines and interpreted in a similar manner as was described above.

What is claimed is:

1. A semiconductor memory apparatus, comprising:

a plurality of memory cells arranged in rows and columns;

a plurality of redundant columns, at least two of said redundant columns associated with one defective column;

a plurality of redundant column decoders for selecting one or more of said redundant columns in response to a column address signal indicating a defective column;

a plurality of column decoders for selecting one or more columns in response to the column address signal;

at least one IO signal coupled to said columns and said redundant columns, said IO signal representing a combination of data values received from said selected columns and said redundant columns; and a first circuit element receiving said IO signals and outputting a column data value.

2. The apparatus of claim 1, wherein a pair of redundant columns is associated with one defective column and controlled by a single redundant column decoder.

3. The apparatus of claim 1, further comprising:

said IO signal including a first IO signal and a second IO signal, said first IO signal representing a combination of voltages provided from each selected column and selected redundant column, said second IO signal representing a combination of complementary voltages provided from each selected column and selected redundant column; and said first circuit element including a sense amplifier receiving the first and second IO signals and generating the column data value based on said first and second IO signals.

4. The apparatus of claim 3, wherein said sense amplifier is a differential amplifier.

5. The apparatus of claim 1, a column repair circuit element coupled to each redundant column decoder, said column repair circuit receiving said column address signal and enabling a respective redundant column decoder representing a defective column indicated in said column address signal.

6. The apparatus of claim 1, a plurality of redundant rows, at least two of said redundant rows associated with one defective row;

a plurality of redundant row decoders for selecting one or more of said redundant rows in response to a row address signal indicating a defective row; and a plurality of row decoders for selecting one or more rows in response to a row address signal.

7. A method for accessing data in a memory device, said method comprising the steps of:

providing a memory array having a plurality of rows and columns, a first subset of said columns representing defective columns, a second subset of said columns representing redundant columns, at least two of said redundant columns associated with a particular defective column;

receiving a request to access data stored in a defective column;

enabling the redundant columns associated with the defective column;

retrieving data stored in the enabled redundant columns and in the enabled defective column; and interpreting said retrieved data to determine a correct value associated with said requested defective column.

8. The method of claim 7, said enabling step further comprising the steps of:

associating with each pair of redundant columns a redundant column decoder having a pair of select lines, each select line enabling a respective one of the redundant columns in response to an enable signal applied to the redundant column decoder; and setting the enable signal associated with the defective redundant columns.

9. The method of claim 7, said retrieving step further comprising the steps of:

generating a first IO signal representing a combination of voltages from each of said enabled columns; and generating a second IO signal representing a combination of complementary voltages from each of said enabled columns.

10. The method of claim 9, said interpreting step further comprising the step of:

determining the correct value based on a difference between said first and second IO signals.

* * * * *